United States Patent [19]
Smitlener et al.

[11] Patent Number: 6,151,692
[45] Date of Patent: Nov. 21, 2000

[54] INTEGRATED CIRCUIT HAVING MEMORY BUILT-IN SELF TEST (BIST) FOR DIFFERENT MEMORY SIZES AND METHOD OF OPERATION

[75] Inventors: Damir Smitlener; Jay D. McDougal; Charles A. Brown, all of Corvallis, Oreg.

[73] Assignee: Agilent Technologies, Inc., Palo Alto, Calif.

[21] Appl. No.: 09/059,620

[22] Filed: Apr. 8, 1998

[51] Int. Cl.[7] ............................. G11C 29/00; G01R 31/28
[52] U.S. Cl. ........................... 714/718; 714/733; 365/201
[58] Field of Search .............................. 714/718, 30, 733, 714/734, 5, 10, 736, 744, 763; 365/201, 230.05

[56] References Cited

U.S. PATENT DOCUMENTS

| | | | |
|---|---|---|---|
| 5,173,906 | 12/1992 | Dreibelbis et al. ..................... 714/733 |
| 5,535,164 | 7/1996 | Adams et al. ......................... 365/201 |
| 5,617,531 | 4/1997 | Crouch et al. ........................ 714/30 |
| 6,070,256 | 5/2000 | Wu et al. .............................. 714/718 |

*Primary Examiner*—Emmanuel L. Moise

[57] ABSTRACT

An application-specific integrated circuit (ASIC) with a CPU module and a memory module connected to the CPU. The memory has a size selected from a set of alternative memory sizes. The CPU has a memory interface device having an output connected to the memory, and includes a memory test device connected to the memory. The memory test device has a size selector input that receives a memory size code, so that the memory test device is operable to test a memory module of any of the alternative memory sizes in response to alternative memory size codes received on the size selector input. The memory may be RAM or ROM, and the size codes may correspond to address size data stored in the memory test device.

25 Claims, 2 Drawing Sheets

INTEGRATED CIRCUIT HAVING MEMORY BUILT-IN SELF TEST (BIST) FOR DIFFERENT MEMORY SIZES AND METHOD OF OPERATION

FIELD OF THE INVENTION

This invention relates to methods and apparatus for testing memory modules in an integrated circuit, and more particularly to self testing of such memories by components built into an integrated circuit.

BACKGROUND AND SUMMARY OF THE INVENTION

Electronic devices such as computer peripherals, digital cameras, hand held communications and data tools typically include application-specific integrated circuits (ASIC). These ASIC chips are custom designed to satisfy the needs of the product without excess features or capabilities that would needlessly increase the component cost. While a fully custom ASIC provides a cost effective solution for many products, the need for a custom design may limit ASIC usage to higher volume products where the cost of a custom design may be economically amortized. In addition, the duration of the design phase may make the ASIC alternative less attractive than a higher-cost off the shelf IC that can fulfill market demand more immediately.

The design cost and lead time disadvantages may be largely ameliorated by the usage of standard functional modules that are essentially the building blocks of an ASIC. These include central processing units (CPU), interface modules, and memory modules. Instead of designing the entire circuit from scratch, the ASIC designer selects an appropriate collection of off-the-shelf modules, customizes them only as needed, and interconnects them appropriately. The application specific data or instruction sets, or interface circuitry may be included on the ASIC as part of the custom design. In general, it is desirable to minimize the amount of custom work required for a new ASIC.

One ASIC feature that may vary widely from product to product is memory module size. To operate efficiently, the CPU on the chip may have associated memory, such as read only memory (ROM) or random access memory (RAM), or both. To ensure that the memory contents are correct, or that the memory is properly writable and or readable, a memory test capability is normally required. While an unpackaged chip may be probed with contacts from an external tester to exercise the memory, this is unsuitable for testing that may occur each time that the product is operated by the user, and may be unduly slow. Access by the tester to on-chip memory may also be practically limited due to the high cost of pin access, as increasing the number of dedicated test pins increases package size and cost.

To provide faster and more versatile memory testing without external hardware, built-in self testing (BIST) modules have been developed to reside on the ASIC, with a BIST module associated with each memory module. Each BIST module is custom designed for the size of the memory, and operates to send address information to the memory, and read out the data from each address to compare with expected results (RAM testers may also write data to the memory). The BIST must address and read all memory addresses, and stop when all addresses have been read. Proceeding beyond the proper addresses may cause the rereading of the initial addresses or other errors, corrupting test results. There are numerous well known testing algorithms that allow rapid and efficient memory testing.

For memory attached directly to the CPU, it is preferable to include the BIST modules as part of a standard CPU because the design tools used for the semi-custom design process are better able to optimize the timing and circuit layout by designing the CPU and BIST together. With the BIST in the CPU, this advantage may be achieved, but at the cost of requiring the BIST portions of the CPU to be redesigned for each new permutation of memory sizes, with the disadvantages noted above.

The present invention overcomes the limitations of the prior art by providing an ASIC with a CPU module and a memory module connected to the CPU. The memory has a size selected from a set of alternative memory sizes. The CPU has a memory interface device with an output connected to the memory, and includes a memory test device connected to the memory. The memory test device has a size selector input that receives a memory size code, so that the memory test device is operable to test a memory module of any of the alternative memory sizes in response to alternative memory size codes received on the size selector input. The memory may be RAM or ROM, and the size codes may correspond to address size data and or data size data stored in the memory test device.

DETAILED DESCRIPTION OF A PREFERRED EMBODIMENT

Figure 1:
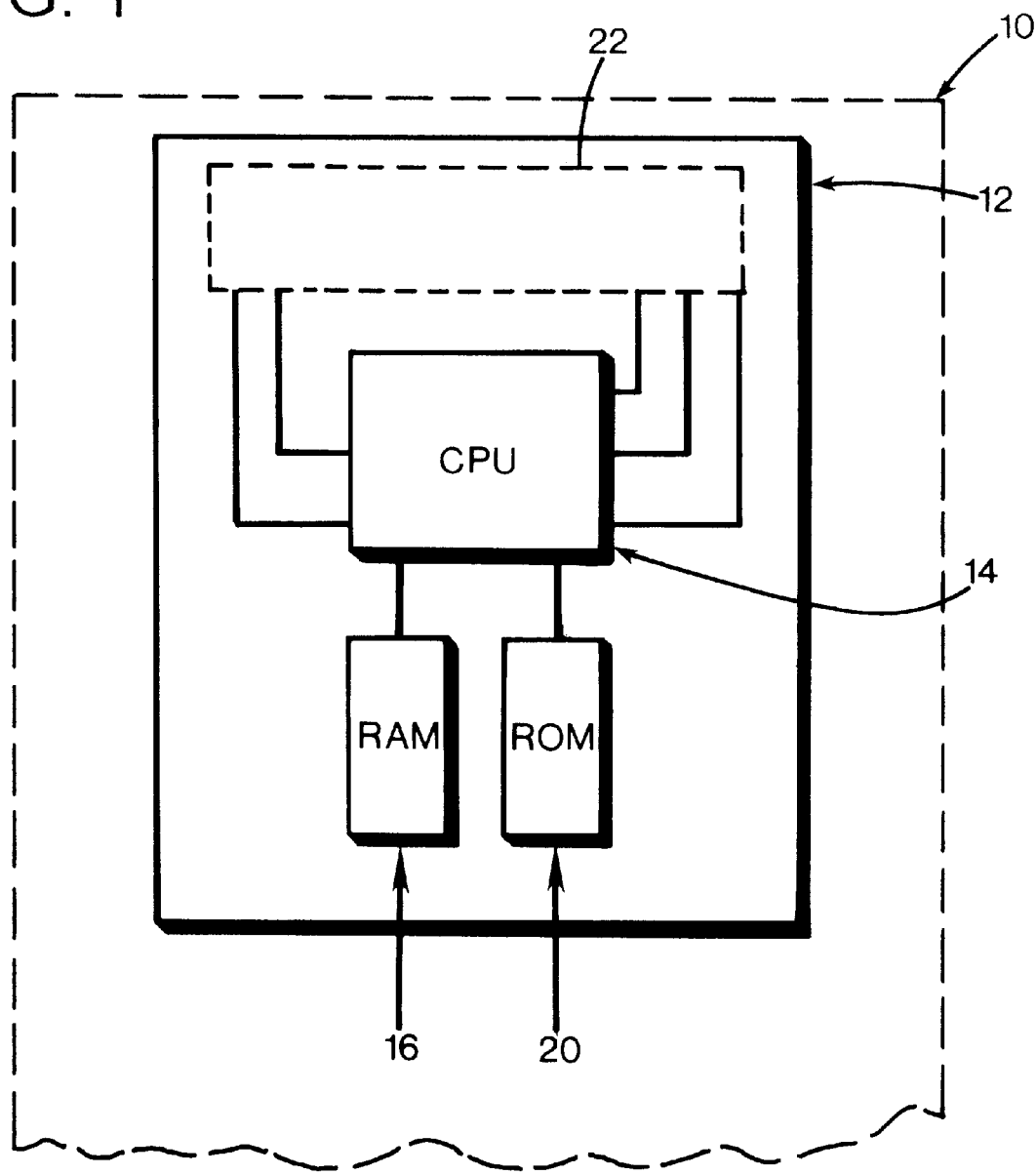
FIG. 1 is a schematic overview block diagram of an electronic device including an ASIC according to a preferred embodiment of the invention.

FIG. 1 shows an electronic product 10 such as a cellular phone, computer printer, digital camera, or any other such device. The product contains at least one application-specific integrated circuit (ASIC) 12, which is interconnected with and controls any of various functional elements of the product, such as displays, user interfaces, power supplies, and data ports, among others. The product may contain several ASIC chips as needed to optimally control different product functions.

The ASIC is a chip that has various functional elements or modules arranged and interconnected at the surface of the chip, with the chip size minimized to reduce cost, and large enough just to include only the needed elements. ASIC chips are designed to provide custom functions, but are normally formed of largely standardized modules to reduce design time and costs.

In the illustrated ASIC 12, a central processing unit (CPU) module 14 provides a computing function on the chip, to control and interface with other modules. The CPU is connected to memory modules 16, 20, which provide data storage for CPU operations. In the illustrated example, memory module 16 is a random access memory (RAM) that may be written to and read from by the CPU; memory module 20 is a read-only memory (ROM) that includes permanently stored data that may be accessed by the CPU. The memory modules may range widely in size, depending on the functional requirements of the CPU and ASIC, and the ASIC may not necessarily include both ROM and RAM in all contemplated embodiments. The ASIC may include multiple CPUs, each with a different dedicated function, and each with its own memory configuration. The CPU is interconnected with other functional modules on the ASIC, the other modules represented by block 22.

Figure 2:
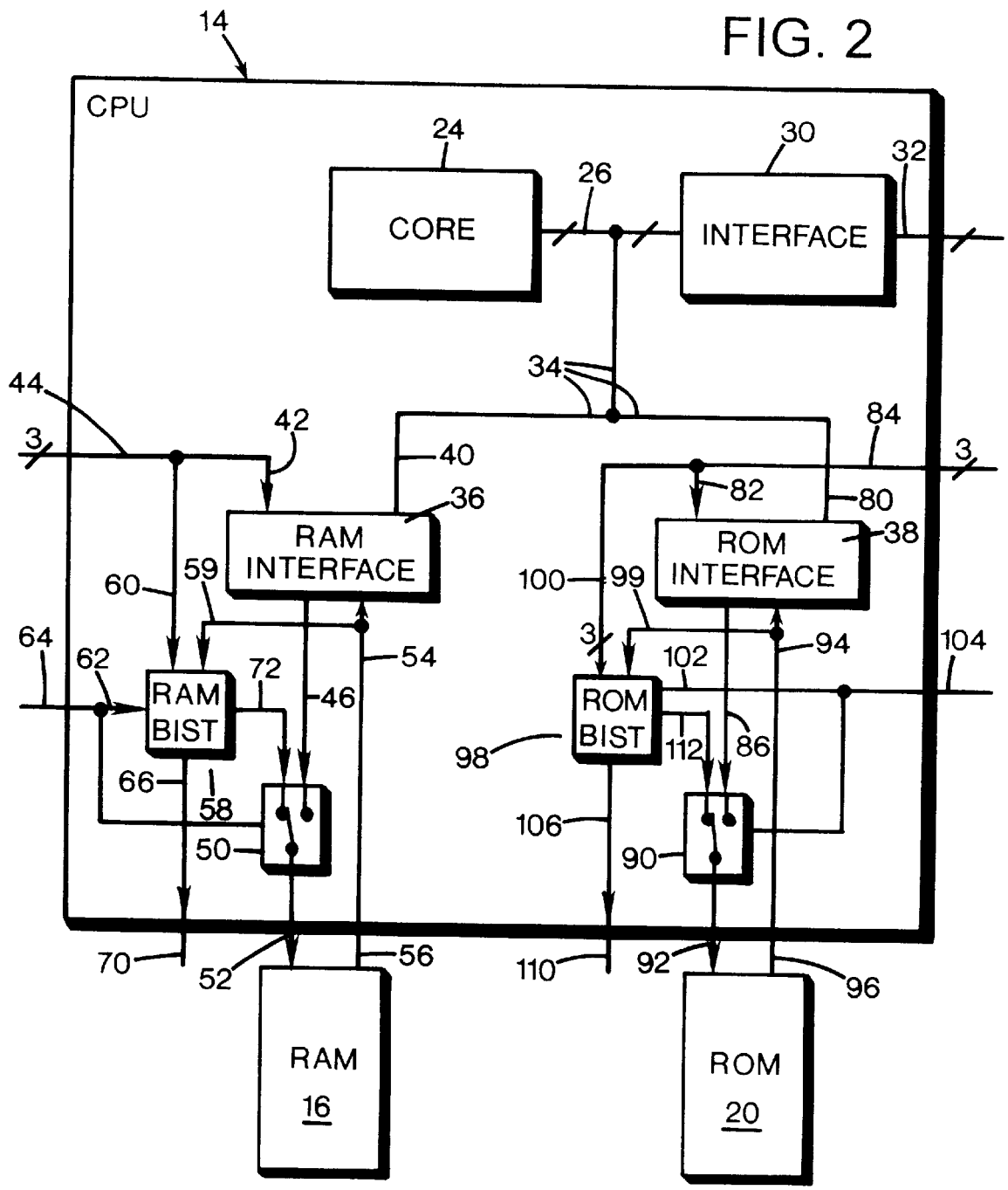
FIG. 2 is a detailed schematic block diagram of a CPU and associated memory according to the embodiment of FIG. 1.

The CPU and memory are shown in greater detail in FIG. 2. The CPU 12 includes a core 24 which is the execution engine that executes instructions and commands to control the operation of other CPU components and modules and components external to the CPU, on or off the ASIC. The core is connected via a main bus 26 to a main interface module 30. The main bus carries data to the CPU for processing, and resulting data from the CPU. An interface bus 32 extends from the interface module to other modules on the ASIC, or to other components in the product. The interface bus provides the resulting data in a format and timing protocol for reading by other components, while not necessarily transmitting unprocessed or intermediate data being communicated within the CPU on the main bus. The main and interface busses have typically 32 data lines, 32 address lines, and several additional control lines, although a wide range of alternatives are possible.

The main data bus includes a branch 34 that connects via a RAM interface module 36 associated with RAM 16, and via a ROM interface module 38 associated with ROM 20. The RAM interface 36 serves to enable the core to write and read data to and from the RAM, and includes a bus input 40 connected to the main bus branch 34, a control bus input 42 connected to a control bus 44 extending off the CPU, an interface output bus line 46 connectable via a switch 50 to a RAM input bus line or memory input node 52 on the RAM module 16, and an interface input bus line 54 connected to a RAM output bus line 56 on the RAM module. The RAM interface reads data from the RAM by sending a RAM memory address code to the RAM via bus line 46, and by reading the resulting data stored at that RAM address via bus line 54. To write data, the RAM interface sends the address code and the data string to be written to the selected address.

To test the RAM function or data contents for faults or errors, a RAM built-in self test (BIST) module 58 is connectable to the RAM 16. The BIST includes a memory input 59 line connected to line 54, a control input 60 connected to control bus 44, an activation input 62 connected to a test activation line 64, and a pass/fail output 66 connected to a result line 70 that extends from the CPU. Although not illustrated, the pass/fail output includes a second line providing a test-complete signal.

The RAM BIST includes eight stored memory size strings, each associated with a unique 3 bit code. The codes are 000, 001, 010, 011, 100, 101, 110, and 111, corresponding to BIST-stored top address strings of 0000000000000, 0000001111111, 0000011111111, . . . , 1111111111111. These reflect memory size alternatives of 0 (no memory), 512B, 1KB, and doubling sequentially up to the maximum size of 32KB.

The BIST operates like existing BIST modules in that it transmits addresses and data to the RAM, and monitors the response from the RAM to ensure that the resulting data from the RAM is as expected during normal function. Such BIST modules employ any of numerous testing algorithms that sequentially write simple data strings to each memory address, then read back the data to ensure that it was properly written and read.

Conventional BIST units are custom designed for a given memory module, with a single size parameter corresponding to the size of the memory module. Specifically, the size parameter is a digital value indicating how many write and or read commands the BIST must cycle through to read exactly all the memory's addresses. Similarly, the data width value in the BIST must be matched to the memory to be tested.

In the preferred embodiment, the eight different size parameters are stored to permit flexibility in selecting a wide range of alternative memory sizes noted above. When a memory size is selected during ASIC design, the corresponding 3-bit code is preferably hard wired in by connecting appropriate lines of the three line control bus 44 to logic high or low levels, a minimal design task that enables a single standard CPU to be used with the range of memory sizes available in the selected set. The three bit code on the control bus 44 also connects to the RAM interface to provide it with the memory size information needed to properly interface with the memory.

When testing is required, such as when the device is turned on for use, or at selected intervals, a controlling ASIC component sends an activation signal on the test activation line 64. This initiates BIST operations, and further operates switch 50 to connect a BIST output line 72 to the RAM input while disconnecting the RAM interface output line 46 from the RAM. The BIST then cycles through RAM testing operations, and determines whether the RAM passed or failed. A pass or fail signal is output on line 70, which is received by controlling ASIC components that respond to a fail by generating fault codes. A test complete signal sent on the second conductor of line 70 indicates when normal operation may proceed following a passed test.

The ROM interface and testing components and procedures operate similarly to the RAM portion, except that the ROM is not written to during operation or testing. The ROM interface 38 serves to enable the core to read data from the ROM 20, and includes a bus input 80 connected to the main bus branch 34, a control bus input 82 connected to a ROM control bus 84 (independent of the RAM bus) extending off the CPU, an interface output bus line 86 connectable via a switch 90 to a ROM input bus line 92 on the ROM module 20, and an interface input bus line 94 connected to a ROM output bus line 96 on the ROM module. The ROM interface reads data from the ROM by sending a ROM memory address code to the ROM via bus line 86, and reading the resulting data stored at that ROM address via bus line 94.

To test the ROM function or data contents for faults or errors, a ROM built-in self test (BIST) module 98 is connectable to the ROM 16. The BIST includes a memory input 99 bus line connected to bus line 94, a control input 100 connected to control bus 84, an activation input 102 connected to a test activation line 104, and a pass/fail output 106 (having two lines as noted above with respect to RAM testing) connected to a result line 110 that extends from the CPU. The ROM BIST includes eight stored memory size strings, each associated with a unique 3 bit code. The codes are 000, 001, 010, 011, 100, 101, 110, and 111, corresponding to BIST-stored top address strings of 0000000000000, 0000001111111, 0000011111111, . . . , 1111111111111. These reflect memory size alternatives of 0 (no memory), 512B, 1KB, and doubling sequentially up to the maximum size of 32KB.

The ROM BIST operates like existing ROM BIST modules in that it transmits addresses to the ROM, and reads data from the ROM to ensure that the resulting data is as expected during normal function. Such BIST modules employ any of numerous testing algorithms that sequentially modify a known value stored in the BIST based on the data blocks received from each memory address during a high speed test. The resulting modified value is readily compared with an expected value stored in the BIST. The values being referred to as "stored" may in fact be preselected during ASIC or module design, and represented permanently in the patterns of the chip.

In the preferred embodiment, the eight different size parameters are stored to permit flexibility in selecting a wide range of alternative memory sizes noted above. The size parameters are independent of those for RAM sizes, and depend on the likely size ranges typically required for each type of memory. As with RAM discussed above, when a ROM size is selected during ASIC design, the corresponding 3-bit code is preferably hard wired by connecting appropriate lines of the three line control bus 84 to logic high or low levels, independently of the code established for RAM size. The three bit code on the control bus 84 also connects to the ROM interface to provide it with the memory size information needed to properly interface with the memory.

When testing is required, such as during production testing, when the device is turned on for use, or at selected intervals, a controlling ASIC component sends an activation signal on the test activation line 104. This initiates BIST operations, and further operates switch 90 to connect a BIST output line 112 to the ROM input while disconnecting the ROM interface output line 86 from the ROM. The BIST then cycles through ROM testing operations, and determines whether the ROM passed or failed. A pass or fail signal is output on line 110, which is received by controlling ASIC components that respond to a fail by generating fault codes. A test complete signal sent on the second conductor of line 110 indicates when normal operation may proceed following a passed test.

While the above is discussed in terms of preferred and alternative embodiments, the invention is not intended to be so limited. For instance, any number of RAM or ROM memory sizes may be included in the set of alternatives. The number of control lines to each BIST module being "n", the number of size alternatives is $2^n$. In addition, the selectable memory parameter may be expanded beyond the number of addresses, to the width of the memory, or other characteristics.

What is claimed is:

1. An electronic circuit comprising:
   a processor including a memory interface device having an interface output connected to a memory input node;
   a memory test device connected to the memory input node;
   the memory test device including a plurality of selectable parameter sets, each parameter set corresponding to a different memory size selected from a group of selected memory sizes, such that the memory test device is operable to test a memory device of any of the selected memory sizes having a memory input connected to the memory input node; and
   a switch having a first input, a second input, and an output, and operable to select exactly one of the inputs for connection to the output; and
   the output of the switch being connected to the memory input node, the first input of the switch being connected to the memory test device, and the second input of the switch being connected to the memory interface device.

2. The circuit of claim 1 wherein the memory test device includes a test input connected to a memory output node, such that the memory test device is operable to read data from the output of a connected memory output node.

3. The circuit of claim 1 wherein the memory test device includes a size selector input.

4. The circuit of claim 3 wherein the size selector input is a multi line bus, and wherein the memory test device is operable to read a multi bit binary code from the bus to select a corresponding parameter set.

5. The circuit of claim 4 wherein the number of lines of the size selector input bus is n, and the number of parameter sets is $(2)^n$.

6. The circuit of claim 3 wherein the size selector input is connected to the memory interface device.

7. The circuit of claim 1 wherein the entire circuit is formed on a single integrated circuit chip.

8. The circuit of claim 1 wherein the memory device is a random access memory.

9. The circuit of claim 1 wherein the memory device is a read only memory.

10. An application specific integrated circuit comprising:
    a standard central processing unit module;
    a memory module connected to the central processing unit module and having a selected size selected from a set of alternative memory sizes
    the standard central processing unit module including a memory interface device having an interface output connected to the memory module;
    the standard central processing unit module including a memory test device connected to the memory module;
    the memory test device including a size selector input, such that the memory test device is operable to test a memory module of any of the alternative memory sizes in response to alternative memory size codes received on the size selector input; and
    a switch having a first input, a second input, and an output, and operable to select exactly one of the inputs for connection to the output; and
    the output of the switch being connected to the memory input node, the first input of the switch being connected to the memory test device, and the second input of the switch being connected to the memory interface device.

11. The circuit of claim 10 wherein the memory test device is operable to receive a memory size code corresponding to the size of the selected memory module on the size selector input.

12. The circuit of claim 10 wherein the memory test device includes a plurality of selectable parameter sets, each parameter set corresponding to a different one of the alternative memory sizes.

13. The circuit of claim 10 wherein the size selector input is a multi line bus, and wherein the memory test device is operable to read a multi bit binary word from the bus to select a memory size.

14. The circuit of claim 13 wherein the number of lines of the size selector input bus is n, and the number of memory sizes is $(2)^n$.

15. The circuit of claim 10 wherein the size selector input is connected to the memory interface device.

16. An electronic circuit comprising:
    a processor including a memory device having a memory input node
    the memory device having a memory size selected from a group of selected memory sizes;
    a memory interface device having an interface output connected to the memory input node;
    a memory test device connected to the memory input node;
    the memory test device including a plurality of selectable parameter sets, each parameter set corresponding to a different memory size selected from the group of selected memory sizes; and
    the memory test device having a memory size selector input that is hard wired to continuously generate a code corresponding to the parameter set corresponding to the memory size of the memory device.

17. The circuit of claim 16 wherein the memory test device includes a test input connected to a memory output node, such that the memory test device is operable to read data from the output of a connected to the memory output node.

18. The circuit of claim 16 wherein the memory size selector input is a multi line bus, and wherein the lines of the bus are each connected to a voltage level selected from logic high and logic low.

19. The circuit of claim 16 including a switch connected to the memory input node, to the memory test device, and to the memory interface device, and the switch being operable to exclusively connect to the memory node either the memory test device or the memory interface device.

20. The circuit of claim 16 wherein the entire circuit is formed on a single integrated circuit chip.

21. An application specific integrated circuit comprising:

a standard central processing unit module;

a memory module connected to the central processing unit module and having a selected size selected from a set of alternative memory sizes;

the standard central processing unit module including a memory interface device having an interface output connected to the memory module;

the standard central processing unit module including a memory test device connected to the memory module; and the memory test device including a size selector input hard wired to a code corresponding to the memory module, such that the memory test device is operable to test the memory module.

22. The circuit of claim 21 wherein the memory test device includes a plurality of selectable parameter sets, each parameter set corresponding to a different one of the alternative memory sizes.

23. The circuit of claim 21 wherein the size selector input is a multi line bus, and wherein the lines of the bus are each connected to a voltage level selected from logic high and logic low.

24. The circuit of claim 21 wherein the size selector input is connected to the memory interface device.

25. The circuit of claim 21 including a switch connected to the memory input node, to the memory test device, and to the memory interface device, and the switch being operable to exclusively connect to the memory node either the memory test device or the memory interface device.

* * * * *